Figure 1:
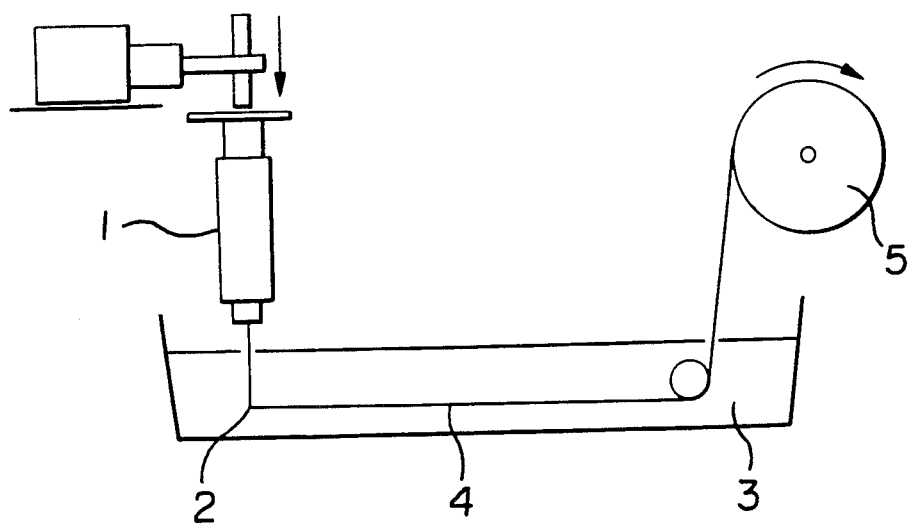

United States Patent [19]

Chida et al.

[11] Patent Number: 5,064,596

[45] Date of Patent: Nov. 12, 1991

[54] PROCESS FOR PREPARING A SLENDER OR THIN CERAMIC GREEN BODY

[75] Inventors: Yukio Chida; Tetsuhiko Mishimura, both of Machida; Yasuo Oguri, Tokyo, all of Japan

[73] Assignee: Mitsubishi Kasei Corporation, Tokyo, Japan

[21] Appl. No.: 574,527

[22] Filed: Aug. 28, 1990

Related U.S. Application Data

[63] Continuation of Ser. No. 58,870, Jun. 5, 1987, abandoned.

[30] Foreign Application Priority Data

Jun. 6, 1986 [JP] Japan ................... 61-131207
Nov. 21, 1986 [JP] Japan ................... 61-277942

[51] Int. Cl.⁵ ............................ C04B 38/04
[52] U.S. Cl. ................... 264/181; 264/63; 264/203; 264/210.3; 264/298; 264/211.11
[58] Field of Search .............. 264/63, 211, 11, 177.11, 264/203, 210.3, 344, 298, 181

[56] References Cited

U.S. PATENT DOCUMENTS 2,939,199 6/1960 Strivens .................... 264/63
3,953,562 4/1976 Hait et al. ................. 264/63
4,153,760 5/1979 Sundberg ............... 264/211.11

FOREIGN PATENT DOCUMENTS 615429 2/1961 Canada ..................... 264/63
60-15566 8/1985 Japan .

OTHER PUBLICATIONS

Chemical Abstracts, vol. 104, No. 20, May 1986, p. 288, Abstract No. 173148y, Abstract of JP-A-60-155566.
Japanese Patents Gazette, Section CH, Week 8539, 6th Nov., 1985, Class L, p. 23, Abstract No. 85-239508/39.
Chemical Abstracts, vol. 103, No. 26, Dec. 1985, p. 290, Abstract No. 219864p, Abstract of JP-A-60-155556.
American Ceramic Society Bulletin, vol. 65, No. 4, Apr. 1986, pp. 637-638.

Primary Examiner—James Derrington
Attorney, Agent, or Firm—Oblon, Spivak, McClelland, Maier & Neustadt

[57] ABSTRACT

A process for preparing a slender or thin ceramic green body, which comprises discharging a raw material slurry comprising a ceramic powder raw material, a binder and a solvent from a discharge outlet in a slender or thin shape, and then contacting it with a solidifying liquid composed of a liquid in which the solvent is soluble and the ceramic powder raw material and the binder are insoluble or hardly soluble so that the solvent in the slurry is dissolved and removed to form the green body.

17 Claims, 1 Drawing Sheet

PROCESS FOR PREPARING A SLENDER OR THIN CERAMIC GREEN BODY

This application is a continuation of application Ser. No. 07/058,870 filed on June 5, 1987.

The present invention relates to a process for preparing a slender or thin ceramic green body. More particularly, the present invention relates to a process for preparing a fiber or sheet-shaped ceramic green body.

Heretofore, several methods have been known for the preparation of slender or thin ceramic products i.e. fiber or sheet-shaped products among various ceramic shaped products.

Processes for the production of ceramic fibers have been reported in several literatures. A typical process is a dry spinning method as disclosed in e.g. "Chemistry and Industry" Vol. 31 [9] p706 (1978).

Further, a process for producing in organic fibers by a wet spinning method is disclosed, for instance, in Japanese Unexamined patent Publication No. 25,420/1972. However, this process comprises spinning a starting solution comprising a polyvinyl alcohol and an aluminum halide and/or nitrate to obtain precursor fibers, followed by decomposition and sintering treatment at a high temperature of higher than the above temperature, to obtain alumina fibers, whereby as the prerequisites for the wet spinning, a material compatible with the polyvinyl alcohol as the binder is used as the fiber-forming precursor compound, and the spinning liquid is in the form of a solution.

On the other hand, ceramic green sheets have been prepared by a process like a doctor blade process which comprises coating on a support plate such as an organic film or metal, a slurry prepared by mixing a ceramic powder raw material, an organic binder, a plasticizer, a solvent, etc., and then removing the solvent, for instance, by drying to solidify the slurry, followed by peeling the solidified product from the support plate.

However, in the case of fibers, the dry spinning method has difficulties such that the spinning properties tend to be very poor because of the use of powder, particularly when the proportion of the powder in the spinning solution increases, and it becomes difficult to obtain continuous fibers constantly.

On the other hand, according to the above mentioned wet spinning method, the raw material is limited since only a raw material compatible with the polyvinyl alcohol as a binder is useful, and thus the applicable range is restricted.

In the case of a sheet or film, if the thickness becomes thin, it becomes difficult to obtain a sheet having a uniform thickness because of the problems with respect to the precision of the doctor blade or the precision of the support plate such as an organic film. Further, it becomes very difficult to peel off such a thin green sheet without rapture from the organic film or metal plate as the support plate. For this reasons, usually 30 $\mu$m is regarded as the lower limit in the thickness.

However, in the industry such as in the field of laminated ceramic capacitors, there is a strong demand for miniaturization and large capacity, and it is strongly desired not only to develop a highly dielectric material but also to obtain a large capacity by making each ceramic layer thinner. As a method for obtaining a sheet having a thickness of less than 30 $\mu$m, Japanese Unexamined Patent Publication No. 184764/1984 proposes a method whereby a sheet having a thickness of about 10 $\mu$m can be obtained. However, this method requires cumbersome operations including a necessity of heat pressing (at 285° C., 100 kg/cm$^2$) a green sheet preliminarily molded to have thickness of 50 $\mu$m, and thus it is not suitable for industrial application. Further, as a method for obtaining a ceramic green sheet having a thickness of 10 $\mu$m or less, it has been proposed to add a surfactant to a solution containing the desired oxide or a precursor capable of being converted to the desired oxide, to spread a film of the oxide or the precursor in a frame (Japanese Unexamined Patent publication No, 122155/1986). In this method, it is necessary to employ a special solution or colloidal starting material, and the obtainable substance is limited.

As described in the foregoing, various difficulties exist in the production of a slender or thin ceramic green body such as a fiber or sheet-shaped ceramic green body. Therefore, it has been desired to develop a process which can be applied to a wide range of ceramics and yet which is simple and industrially advantageous.

The present inventors have conducted various studies to overcome such problems in the production of a slender or thin ceramic green body, and as a result, have found that by contacting a raw material slurry having a specific composition with a solidifying liquid having a specific nature, it is possible to use a wide range of ceramics in a powder form as the ceramic raw material, and to obtain a slender or thin ceramic green body constantly, and particularly in the case of a sheet, it is possible to obtain a sheet having a thickness of 30 $\mu$m (which used to be regarded as the lower limit) or less, particularly from 1 to 10 $\mu$m, quite easily. The present invention has been accomplished on the basis of this discovery.

Namely, the present invention provides a process for preparing a slender or thin ceramic green body, which comprises discharging a raw material slurry comprising a ceramic powder raw material, a binder and a solvent from a discharge outlet in a slender or thin shape which is not solidified, and immediately contacting it with a solidifying liquid composed of a liquid in which the solvent is soluble and the ceramic powder raw material and the binder are insoluble or hardly soluble so that the solvent in the slurry is dissolved and removed to solidify the slurry to form the green body.

Now, the present invention will be described in detail with reference to the preferred embodiments.

In the companying drawing, FIG. 1 is a diagrammatic view of an embodiment of the apparatus to be used for the preparation of a fiber-like ceramic green body of the present invention.

In the present invention, "slender or thin" is meant for a fiber-like in the sense of "slender" or a sheet-like in the sense of "thin". The degree of "slender" or "thin" is generally at a level where the solvent in the slurry can be removed by contacting it with the solidifying liquid. The actual numerical value may vary within a wide range and can not simply be specified. Usually however, in the case of fiber-like shape, the fiber diameter is preferably not more than 100 $\mu$m, more preferably not more than 50 $\mu$m, and in the case of the sheet-like shape, the process is applicable to an extremely thin sheet which may be more appropriately called a thin film, and which usually has a thickness of not more than 50 $\mu$m, preferably not more than 20 $\mu$m. The lower limit for such a diameter or thickness is usually 1 $\mu$m, more likely 5 $\mu$m, at present, although the lower limit can be further lowered by the progress in the technology and creation of the demand.

The ceramic powder raw material to be used in the present invention may be any material so long as it is capable of forming a sintered product. Not only a metal oxide such as silicon oxide, titanium oxide or zirconium oxide but also silicon carbide or silicon nitride may be used. Further, multi-component ceramics such as Pb(Zr,Ti)O$_3$, (Pb,La)(Zr,Ti)O$_3$, Pb(Mg$_{1/3}$ and Nb$_{2/3}$)O$_3$-PbZrO$_3$-PbTiO$_3$ which are famous piezoelectric ceramics, or BaTiO$_3$, SrTiO$_3$ or PbTiO$_3$, and a system obtained by adding a very small amount of an additive such as a sintering assistant to such ceramics, may all be useful, so long as they are able to form sintered products by conventional processes for the production of ceramics.

As the ceramic powder raw material, a powder produced by a conventional method may be employed. According to the process of the present invention, the slender or thin ceramic green body can be prepared even when a powder having a particle size as large as a few tens micrometers is used. Therefore, special and cumbersome fine particle-forming and sol-forming operations, which are required in the case of a conventional method wherein a sol of fine particles having a particle size of about 100 Å is used, are not required, and a powder obtainable by a usual mechanical pulverization, can be used. However, use of particles as large as a few tens micrometers is disadvantageous in that a high temperature is required for the preparation of ceramics, or a large amount of a sintering additive will be required. Therefore, in the case of fibers, it is usual to employ a powder having a particle size of not higher than 5 μm. Further, in a case where the fibers obtained by sintering are required to have adequate flexibility, the fibers are required to be as fine as from 10 to 20 μm. Also from this viewpoint, the maximum size of the ceramic powder raw material should be at a level of from 10 to 20 μm. Especially when it is required to obtain a particularly thin green sheet, the particle size should be smaller accordingly. Usually, for the thickness of from 5 to 10 μm, the particle size may be at a level of 1 μm.

As the ceramic powder raw material, it is preferred to employ a powder crystallized by presintering or by any other suitable method, or a material which does not undergo crystallization after the decomposition by sintering. If an amorphous material or a material susceptible to decomposition and crystallization by sintering, is used, it becomes difficult to obtain a dense sintered product having a uniform grain size due to a substantial shrinkage upon sintering or an abnormal grain growth during crystallization or formation of pores.

The binder for the present invention may be any binder which is commonly used as a binder for the ceramic raw material. It is preferred to use a substance which evaporates upon sintering, so that it does not remain as an impurity in the final ceramics. In the practical use, the binder and the solvent are determined on the basis of the relation with the solidifying liquid. In short, the solidifying liquid may be selected from liquids in which the solvent in the raw material slurry is soluble and other components are insoluble or hardly soluble. Specific combinations of the binder, the solvent and the solidifying liquid are shown in Table 1. Among them, in order to form a thin film, the slurry is preferably capable of being spread on the solidifying liquid. Namely, for the slurry to be spread on the surface of the solidifying liquid, the expansion coefficient represented by the following equation must be positive, preferably at least 25 dyn/cm for excellent spreading:

Expansion coefficient $= C - (A + B)$ where A is the surface tension of the slurry, B is the interfacial tension between the slurry and the solidifying liquid, and C is the surface tension of the solidifying liquid. Accordingly, the value of C is required to be large, and as the solidifying liquid, water is usually preferred since the surface tension of water is usually greater than that of an organic binder or solvent.

Further, the surface tension of the slurry and the interfacial tension between the slurry and the solidifying liquid substantially correspond to the surface tension and the interfacial tension of the solvent in the slurry so long as the composition in the slurry except for the solvent is the same. Therefore, it is preferred to select a solvent having a small surface tension and interfacial tension.

If the solvent concentration in the solidifying liquid is too high, the binder is likely to be dissolved in the solidifying liquid, such being undesirable. Likewise, it is not desirable to use a binder which is soluble in the solidifying liquid or which undergoes a chemical or physical change such as swelling when contacted with the solidifying liquid.

From the foregoing respects, combinations 12 to 18 are preferred among the combinations shown in Table 1.

TABLE 1

| No. | Binder | Solvent | Solidifying liquid |
|---|---|---|---|
| 1 | Polyvinyl alcohol | Water | Aqueous ammonium sulfide solution |
| 2 | Polyvinyl alcohol | Water | Acetone |
| 3 | Polyvinyl alcohol | Water | Ethanol |
| 4 | Polyvinyl alcohol | Water | Ethyl Cellosolve |
| 5 | Polyacrylonitrile | Dimethylformamide | Water |
| 6 | Polyacrylonitrile | Aqueous ammonium thiocyanate solution | Water |
| 7 | Nitrocellulose | Acetone | Water |
| 8 | Cellulose acetate | Acetone | Water |
| 9 | Polyvinylidene chloride | Dimethylformamide | Acetone |
| 10 | Polyvinyl chloride | Dimethyl formamide | Acetone |
| 11 | Polyvinyl butyral | Methyl ethyl ketone | Water |
| 12 | Polyvinyl butyral | Ethanol | Water |
| 13 | Polyvinyl butyral | Ethyl cellosolve | Water |
| 14 | Polyvinyl butyral | Acetone | Water |
| 15 | Polymethyl methacrylate | Ethanol | Water |
| 16 | Methacrylate copolymer* | Methyl ethyl ketone | Water |
| 17 | Polyvinyl acetate | Ethanol | Water |
| 18 | Polyvinyl chloride-vinyl acetate copolymer | Cyclohexanone | Water |

*e.g. ethyl methacrylate 72-methyl acrylate 28 copolymer, or methyl methacrylate 10–15-butyl methacrylate 60–65-cyclohexyl methacrylate 20–25 copolymer Further, a plasticizer may usually be added. In such a case, the type and amount of the plasticizer will be determined depending upon the binder used and the desired flexibility of the shaped product. For instance, a phthalic acid ester-type plasticizer such as dimethyl phthalate, diethyl phthalate or dibutyl phthalate, is used in many cases. Like the plasticizer, a dispersing agent for the ceramic powder used, may be incorporated. In such a case, the plasticizer and the dispersant may be selected preferably from substances which do not undergo chemical or physical changes such as dissolution upon contact with the solidifying liquid.

For the preparation of the raw material slurry, a conventional process for the production of ceramics may be employed.

Namely, the raw material slurry is prepared by adding to the ceramic powder raw material obtained by the above-mentioned conventional method, predetermined amounts of the binder, the solvent and, if necessary, additives such as a plasticizer and a dispersing agent, dispersing and dissolving the mixture in the solvent, and kneading the mixture by means of e.g. a ballmill.

The raw material slurry usually comprises from 40 to 90% by weight of the ceramic powder raw material, from 2 to 30% by weight of the binder and from 10 to 60% by weight of the solvent. Optionally, from 0.5 to 8% by weight of a plasticizer and from 0.1 to 2.0% by weight of a dispersing agent may be added thereto. If the ceramic powder raw material is less than 40% by weight, it becomes difficult to obtain a dense sintered product after the sintering. On the other hand, if the ceramic powder raw material exceeds 90% by weight, it becomes difficult to obtain a satisfactory shaped product. The plasticizer to be used may be a phthalic acid ester such as dibutyl phthalate or dioctyl phthalate in the case where the polyvinyl butylal is used as the binder, and it may be glycerin or ethylene glycol in the case where polyvinyl alcohol is used as the binder. However, the plasticizer is not limited to such specific examples.

The amount of the solvent to be used for the preparation of the slurry is properly determined to adjust the viscosity of the slurry. The amount of the solvent is usually determined to bring the viscosity within a range of from 100 to 10,000 cps, since molding can be conducted if the viscosity is within this range.

The slurry thus prepared is discharged from an outlet to bring it in contact with the solidifying liquid. The manner of the contact is properly selected depending upon the desired shape of the molded product. For example, in order to obtain a fiber-like product, the slurry may be extruded from a monofilament nozzle hole of e.g. an injector or from a spinneret for mutifilaments. Also in the case of a sheet-like product, it is possible to extrude the slurry from an extrusion head having a desired shape. However, it is preferred that the slurry is dropped from an injector or overflown over an overflow edge to permit it spread on the surface of the solidifying liquid by the surface tension, whereby a uniform thin film-like ceramic green body can be obtained.

Specifically, for instance, the extrusion of the raw material slurry into a fiber form under stretching can be conducted, for example by the apparatus diagrammatically illustrated in FIG. 1, although there is no particular restriction as to the molding method. In this apparatus, from an orifice 2 of an extruder 1 such as an injector, the raw material slurry is extruded into the solidifying liquid 3. The extruded slurry 4 passes through the solidifying liquid 3 while being stretched by a wind-up machine 4 provided in or out of the solidifying liquid, whereby the solvent in the slurry 4 is dissolved and absorbed in the solidifying liquid 3, whereupon the slurry solidifies and finally wound up by the wind-up machine 5. The fiber diameter of the fiber-like shaped product is determined by the size of the orifice, the extrusion rate and the winding-up rate, and the respective conditions are adjusted depending upon the desired fiber diameter.

When a sheet is to be obtained by spreading the raw material slurry on the surface of the solidifying liquid, the following method may be employed. For instance, the raw material slurry is dropped directly on the solidifying liquid by means of e.g. an injector, or the slurry is dropped inbetween a pair of divider rods movable in contact with the surface of the solidifying liquid and the space between the divider rods are adjusted so that the slurry is spread on the solidifying liquid to have a predetermined surface area or thickness (see e.g. Japanese Unexamined patent Publication No. 41958/1975). The thickness of the green sheet may be controlled by the spreading surface area and the spreading speed. There is a general tendency that the higher the spreading speed, the thinner the resulting sheet. The slurry solidifies as the solvent in the slurry diffuses into air or into the solidifying liquid during or after the slurry is spread on the surface of the solidifying liquid.

The solidified green sheet may be taken out by a conventional method. For instance, it may be taken out by means of a ring-shaped frame or may be taken out as supported on porous support.

The green sheet taken out from the solidifying liquid, will then be dried in a suitable process to obtain a ceramic green sheet.

The ceramic green body obtained by the present invention, whether it is in the form of a fiber or sheet, may sometimes be used as it is. However, in most cases, the green body is subjected to sintering treatment to sinter the ceramic particles.

The sintering conditions such as the temperature, time and atmosphere, vary to a large extent depending upon the type of the ceramics, and can not generally be defined. However, such conditions can suitably be selected from those known in the sintering treatment of the respective ceramics.

Now, the present invention will be described in further detail with reference to Examples. However, it should be understood that the present invention is by no means restricted to such specific Examples.

EXAMPLE 1

(1) Preparation of a raw material slurry 60.1 g of commercially available lead titanate zirconate (60A manufactured by Fuji Titan Kogyo K.K., average particle size: about 1 $\mu$m), 4.8 g of polyvinyl butyral (LB-1, manufactured by Sekisui Chemical Company Ltd.) as a binder, 4.2 g of dibutyl phthalate as a plasticizer, 1.7 g of a dispersing agent and 16.7 g of ethyl Cellosolve as a solvent, were kneaded for 48 hours by means of a ballmill. The viscosity of the slurry thus obtained was 2,925 cps (12 rpm, 20° C.) as measured by a Brookfield type viscometer.

(2) Preparation of a fiber-like shaped product (apparatus of FIG. 1 used)

The slurry thus prepared was introduced into an injector having a nozzle diameter of 20 $\mu$m and a capacity of 5 cc, and extruded into water used as a solidifying liquid. The solidified product was wound up at a wind-up speed of about 30 cm/sec so that the stretching ratio of the withdrawing rate of the solidified product to the discharging rate of the slurry was 8. (The stretching ratio is usually within a range of from 2 to 100.) The temperature of the solidifying liquid at that time was about 20° C., and the length of the solidifying liquid tank was 1 m. The shaped product thus obtained had a density of 4.4 g/cm$^3$ and a diameter of about 25 μm.

(3) Preparation of a fiber-like sintered product

The shaped product thus obtained was introduced into an alumina crucible having a depth about 20 cm, and under a lead oxide atmosphere, lead zirconate was introduced as a regulating agent. Then, an alumina lid was placed on the crucible. Then, the temperature was raised to 500° C. at a rate of 25° C./hr, and then maintained at 500° C. for 4 hours. Then, the temperature was raised at a rate of 150° C./hr, and the sintering was conducted at 1,250° C. for 1 hour. The cross section of the sintered fiber thus obtained was inspected by a scanning type electron microscope, whereby no pore was observed, and the sintering was found to be completed substantially to the theoretical density. The fiber diameter was from about 15 to 18 μm, and the fiber had adequate flexibility and was easy to handle.

EXAMPLE 2

The operation was conducted in the same manner as in Example 1 except that the slurry was prepared by using 14.3 g of methyl ethyl ketone as the solvent in the slurry. The results were substantially the same as the results in Example 1.

EXAMPLE 3

The operation was conducted in the same manner as in Example 1 except that a solid solution of lead titanate zirconate with a part of lead substituted by lanthanum (hereinafter referred to as "PLZT") was prepared by the coprecipitation method as disclosed in Japanese Examined Patent publication No. 34524/1980 and used, whereby a fiber-like PLZT sintered product was obtained.

EXAMPLE 4

32 g of lead titanate zirconate as used in Example 1 and an aqueous solution containing 10% of polyvinyl alcohol (pVA 117, manufactured by Kurare K.K.) were kneaded for 48 hours in a ballmill to obtain a slurry. An aqueous solution containing 548 g/l of ammonium sulfate was used as a solidifying liquid. The rest of the operation was conducted in the same manner as in Example 1, whereby a fiber-like sintered product was obtained like in Example 1.

EXAMPLE 5

Acetone was used as a solidifying liquid instead of the solidifying liquid used in Example 4. The rest of the operation was conducted in the same manner as in Example 4, to obtain the same results.

EXAMPLE 6

A slurry was prepared to have a composition comprising 56.7 g of commercially available barium titanate powder (manufactured by Kyoritsu Yogyo K.K.), 4.1 g of polyvinyl butyral (the same type as used in Example 1), 2.3 g of dibutyl phthalate, 1.7 g of a dispersing agent and 38.0 g of ethyl Cellosolve, and a fiber-like shaped product was prepared in the same manner as in Example 1.

The sintering was conducted in an aluminum crucible having the same size as used in Example 1 by raising the temperature to 500° C. at a rate of 25° C./hr, maintaining the temperature at that level for 4 hours, thereafter raising the temperature at a rate of 150° C. hr to 1,400° C., and maintaining it at that level for 1 hour. A fiber-like barium titanate sintered product was obtained like in Example 1.

EXAMPLE 7

| | | |
|---|---|---|
| (a) | Ceramic powder raw material: Lead titanate zirconate (average paticle size: 1 μm) | 60.1 g |
| (b) | Organic binder: Polyvinyl butyral (BL-1, manufactured by Sekisui Chemical Company Ltd.) | 4.8 g |
| (c) | Plasticizer: diButyl phthalate | 4.2 g |
| (d) | Dispersing agent | 1.2 g |
| (e) | Solvent: Ethyl Cellosolve | 16.7 g |

The above raw materials were mixed for 48 hours by means of a ballmill. The viscosity of the slurry thus obtained was 2,915 gps (12 rpm, 20° C.) as measured by a Brookfield type viscometer.

For the molding of a green sheet, water at 20° C. was used as a solidifying liquid, and the above slurry was dropped on the water surface by an injector and permitted to spread. The green sheet thus formed was taken out from the water surface, and dried. Then, the thickness of the sheet was measured and found to be 8 μm.

EXAMPLE 8

The operation was conducted in the same manner as in Example 7 except that the ceramic powder raw material was changed to barium titanate, whereby a green sheet having a thickness of 10 μm was obtained.

EXAMPLE 9

A slurry was prepared by using 60.1 g of lead titanate zirconate as the ceramic powder raw material, 4.8 g of 2-6-polyphenyleneoxide as the organic binder and 25.0 g of benzene as the solvent, and the subsequent operation was conducted in the same manner as in Example 7, whereby a green sheet having a thickness of 5 μm was obtained.

EXAMPLE 10

A green sheet was molded in the same manner as in Example 7 by using the same slurry as used in Example 3, whereby a PLZT green sheet having a thickness of 10 μm was obtained.

EXAMPLE 11

As ceramic powder raw materials, 37.45 g of $Y_2O_3$, 65.44 g of $BaCo_3$ and 39.55 g of CuO were weighted to obtain a composition $YBa_2Cu_3O_7$ for a super conductive material, and mixed by means of a ballmill. Then, the mixture was presintered in air at 900° C. for 8 hours to obtain $YBa_2Cu_3O_7$. Thereafter, the presintered material is again pulverized by a ballmill to obtain a powder raw material of $YBa_2Cu_3O_7$ having a particle size of from 2 to 3 μm. To 50 g of this powder raw material, 4.8 g of polyvinyl butyral (BL-1, manufactured by Sekisui Chemical Company Ltd.) 4.2 g of dibutyl phthalate, 1.2 g of a dispersing agent and 16.7 g of ethyl Cellosolve were added, and mixed for 48 hours by means of a ballmill.

The slurry thus obtained was formed into a fiber product and sheet product in the same manners as in Examples 1 and 7, respectively.

The shaped products thus obtained were sintered in air at 900° C. for 20 hours, to obtain a fiber-like and sheet-like $YBa_2Cu_3O$, ceramics. The fiber-like $YBa_2Cu_3O_7$ thus obtained had a diameter of from 20 to 30 μm. The sheet-like $YBa_2Cu_37$ had a thickness of from 10 to 15 μm. To confirm the super conductivity, the fiber-like and sheet-like $YBa_2Cu_3O_7$ ceramics were cooled by means of liquefied nitrogen and the resistance was measured by a 4-terminal method, whereby the resistance was found to be 0 at 90° K. Further, the magnetizability was measured, whereby a Meissner effect was ascertained.

Instead of the solidifying liquid at 20° C. used in Example 1, the same solidifying liquid at 50° C. was employed, whereby substantially the same result as in Example 1 was obtained, and the shaped product had a diameter of 35 μm.

EXAMPLE 13

Instead of the solidifying liquid at 20° C. used in Example 7, the same solidifying liquid at 50° C. was employed, whereby substantially the same results as in Example 1 were obtained, and the thickness of the green sheet was 15 μm.

EXAMPLE 14

Instead of the injector having a nozzle diameter of 250 μm used in Example 1, the same injector having a nozzle diameter of 500 μm was used, and the winding was conducted at a wind-up speed to bring the stretching ratio to 50 times, whereby the same results as in Example 1 were obtained. The diameter of the shaped product thus obtained was from 8 to 9 μm.

COMPARATIVE EXAMPLE 1

Instead of the solidifying liquid at 20° C. as used in Example 1, the same solidifying liquid at 80° C. was employed, whereby by the fiber-forming properties were poor, and only short shaped products of a level of from 5 to 10 mm were obtained.

COMPARATIVE EXAMPLE 2

Instead of the solidifying liquid at 20° C. as used in Example 1, the same solidifying liquid at 80° C. was used, whereby the spreading properties on the water surface were poor, and only a spreading with a diameter of 1 cm was obtained.

According to the process of the present invention, a usual ceramic powder can be used as the raw material by employing a wet spinning method, whereby a ceramic green body, and consequently its sintered body, can easily be produced without using a special cumbersome process required for the formation of super fine particles such as a sol or without using a special raw material.

Accordingly, the ceramic material useful for the present invention includes basically all substances so long as they are able to provide sintered products. This makes it possible to produce a ceramic green body, and consequently its sintered product having an entirely new function such as an electronic or magnetic function which has not been obtained.

Further, the powder content in the raw material slurry for spinning can be made very high, and evaporation during the sintering can be minimized, whereby it is possible to reduce the shrinkage during the sintering treatment or the amount of pores, and to produce a very dense fiber-like ceramics having a uniform diameter and a very thin ceramic green sheet i.e. thinner than 30 μm which used to be the lower limit, particularly from 1 to 10 μm, and sintered products thereof. Thus, the present invention is expected to contribute substantially to an increase of the capacity of laminated ceramic capacitors and a reduction of the voltage of piezoelectric actuators, and thus is very useful for industrial applications.

We claim:

1. A process for preparing a slender or thin ceramic green body, which comprises discharging a raw material slurry comprising a sinterable ceramic powder, dispersed in a binder and a solvent for the binder from a discharge outlet in a slender or thin shape which is not solidified, and immediately contacting it with a solidifying liquid composed of a liquid in which the solvent is soluble and the sinterable ceramic powder and the binder are insoluble or hardly soluble so that the solvent in the slurry is dissolved and removed to solidify the slurry and to form the green body.

2. The process according to claim 1, wherein the raw material slurry is composed of from 40 to 90% by weight of the sinterable ceramic powder, from 2 to 30% by weight of the binder and from 8 to 60% by weight of the solvent.

3. The process according to claim 1, wherein the sinterable ceramic powder has an average particle size of not larger than 20 μm.

4. The process according to claim 1, wherein the time for the contact of the raw material slurry with the solidifying liquid is at least one second.

5. The process according to claim 1, wherein the temperature of the solidifying liquid is within a range of from room temperature to 60° C.

6. The process according to claim 1, wherein the raw material slurry is discharged into the solidifying liquid through a spinneret having a discharge outlet diameter of from 50 to 500 μm.

7. The process according to claim 1, wherein the raw material slurry is discharged through a film-forming head having a slit clearance of from 50 to 500 μm so that it is spread on the surface of the solidifying liquid by the surface tension.

8. The process according to claim 1, wherein the raw material slurry is discharged from an overflow vessel having an overflow edge at a location from 1 to 10 mm above the surface of the solidifying liquid so that it is spread on the surface of the solidifying liquid by the surface tension.

9. The process according to claim 7 or 8, wherein the raw material slurry is spread with a width of from to 1 to 10 cm.

10. The process according to claim 7, wherein the raw material slurry is brought in contact with the solidifying liquid while being stretched.

11. The process according to claim 1, wherein the discharging rate of the raw material slurry and the withdrawing rate of the solidified green body are adjusted so that the stretching ratio of the withdrawing rate of the solidified green body to the discharging rate of the raw material slurry is within a range of from 2 to 100.

12. The process according to claim 1, wherein the raw material slurry is composed of from 40 to 90% by weight of the sinterable ceramic powder, from 2 to 30% by weight of the binder, from 8 to 60% by weight of the solvent, from 0.5 to 10% by weight of a plasticizer and 0.1 to 2% by weight of a dispersing agent, the plasticizer and dispersing agent being substantially insoluble in the solidifying liquid, and possessing a viscosity within the range of 100 to 10,000 cps.

13. The process according to claim 12, wherein the raw material slurry is discharged into the solidifying liquid through a spinneret having a discharge outlet diameter of from 50 to 500 μm.

14. The process according to claim 12, wherein the raw material slurry is discharged through a film-forming head having a slit clearance of from 50 to 500 μm so that it is spread on the surface of the solidifying liquid by the surface tension.

15. The process according to claim 12, wherein the raw material slurry is discharged from an overflow vessel having an overflow edge at a location from 1 to 10 mm above the surface of the solidifying liquid so that it is spread on the surface of the solidifying liquid by the surface tension.

16. A process according to claim 1 where the sinterable ceramic powder is of an average particle size of at least one micrometer.

17. The process according to claim 1 wherein the sinterable powder is a multi-component ceramic selected from the group consisting of $Pb(ZXr, Ti)O_3$, $(Pb, La)(Zr, Ti)O_3$, $Pb(Mg_{1/3} NB_{2/3})O_3\text{-}PbZrO_3\text{-}PbTiO_3$, $BaTiO_3$, $SrTiO_3$, $PbTiO_3$ and $YBa_2Cu_3O_7$.

* * * * *